US012757578B2

(12) United States Patent
Huang

(10) Patent No.: US 12,757,578 B2
(45) Date of Patent: Oct. 6, 2026

(54) DISPLAY PANEL, MANUFACTURING METHOD THEREFOR, AND DISPLAY DEVICE

(71) Applicant: WUHAN TIANMA MICRO-ELECTRONICS CO., LTD., Wuhan (CN)

(72) Inventor: Dan Huang, Wuhan (CN)

(73) Assignee: WUHAN TIANMA MICRO-ELECTRONICS CO., LTD., Wuhan (CN)

( * ) Notice: Subject to any disclaimer, the term of this patent is extended or adjusted under 35 U.S.C. 154(b) by 537 days.

(21) Appl. No.: 18/327,307

(22) Filed: Jun. 1, 2023

(65) Prior Publication Data

US 2023/0309347 A1 Sep. 28, 2023

(30) Foreign Application Priority Data

Dec. 28, 2022 (CN) ........................ 202211700802.4

(51) Int. Cl.
*H10K 59/122* (2023.01)
*H10K 59/12* (2023.01)
(Continued)

(52) U.S. Cl.
CPC ....... *H10K 59/122* (2023.02); *H10K 59/1201* (2023.02); *H10K 59/173* (2023.02); *H10K 59/35* (2023.02)

(58) Field of Classification Search
CPC ............. H10K 59/122; H10K 59/1201; H10K 59/173; H10K 59/35; H10K 71/166; H10K 59/771
See application file for complete search history.

(56) References Cited

U.S. PATENT DOCUMENTS

| | | | | |
|---|---|---|---|---|
| 9,577,209 B2 * | 2/2017 | Tanada | ............ | H10K 59/80516 |
| 2006/0055999 A1 * | 3/2006 | Bae | ........................ | H10K 71/60 359/245 |

(Continued)

FOREIGN PATENT DOCUMENTS

| | | |
|---|---|---|
| CN | 107808896 A | 3/2018 |
| CN | 109585497 A | 4/2019 |
| CN | 113851509 A | 12/2021 |

OTHER PUBLICATIONS

Office Action mailed Jun. 9, 2025, issued in corresponding Chinese Application No. 202211700802.4, filed Dec. 28, 2022, 15 pages.

*Primary Examiner* — Kevin Quarterman
(74) *Attorney, Agent, or Firm* — CHRISTENSEN O'CONNOR JOHNSON KINDNESS PLLC

(57) ABSTRACT

A display panel and a manufacturing method. The display panel includes a substrate; light-emitting devices and a pixel definition layer that are located at a side of the substrate; and a first spacer structure. The pixel definition layer includes apertures and bank portions, and the apertures include first apertures provided with the light-emitting devices and a second aperture. The first spacer structure is provided in the second aperture. Along a direction perpendicular to a plane of the substrate, one of the bank portions includes a first part, a distance from a surface of the first spacer structure away from the substrate to the substrate is $d_1$, and a distance from a surface of the first part away from the substrate to the substrate is $d_2$, where $d_1 > d_2$. A transmission path of a lateral leakage current between two adjacent sub-pixels can be increased, thereby ameliorating undesirable lighting of sub-pixels.

19 Claims, 6 Drawing Sheets

(51) Int. Cl.
*H10K 59/173* (2023.01)
*H10K 59/35* (2023.01)

(56) References Cited

U.S. PATENT DOCUMENTS

| | | | | |
|---|---|---|---|---|
| 2014/0350366 | A1* | 11/2014 | Akiyama | H10K 65/00 600/328 |
| 2019/0305058 | A1* | 10/2019 | Hou | H10K 71/135 |
| 2021/0280647 | A1* | 9/2021 | Han | H10K 59/352 |
| 2022/0173174 | A1* | 6/2022 | Hatsumi | G09G 3/3208 |
| 2022/0223667 | A1* | 7/2022 | Choi | H10K 59/122 |
| 2023/0209902 | A1* | 6/2023 | Jin | H10K 59/122 257/40 |

* cited by examiner

DISPLAY PANEL, MANUFACTURING METHOD THEREFOR, AND DISPLAY DEVICE

CROSS-REFERENCE TO RELATED APPLICATIONS

The present application claims priority to Chinese Patent Application No. 202211700802.4, filed on Dec. 28, 2022, the content of which is incorporated herein by reference in its entirety.

TECHNICAL FIELD

The present disclosure relates to the technical field of display, and in particular, to a display panel and a manufacturing method therefor, and a display device.

BACKGROUND

An organic light emitting diode (OLED) has characteristics such as self-illumination, high brightness, low power consumption, and fast response, and can realize the manufacturing of a flexible display screen. The organic self-illumination display technology has become the mainstream display technology nowadays. An organic light-emitting panel includes a common layer, which is formed by using an open mask layer. That is, the respective common layers of the sub-pixels are formed simultaneously and connected to each other. A current may flow to an adjacent sub-pixel through the common layer extending in two dimensions. Such a current is called a lateral leakage current. The lateral leakage current leads to undesirable lighting of sub-pixels, affecting the display effect.

SUMMARY

Some embodiments of the present disclosure provide a display panel and a manufacturing method therefor, and a display device to alleviate the technical problem of undesirable lighting of sub-pixels in the related art.

In an aspect, some embodiments of the present disclosure provide a display panel, including: a substrate; light-emitting devices; a pixel definition layer, the light emitting devices and the pixel definition layer being located at a side of the substrate, and the pixel definition layer comprising: apertures comprising first apertures provided with the light-emitting devices and a second aperture, and bank portions; and a first spacer structure provided in the second aperture. Along a direction perpendicular to a plane of the substrate, one bank portion of the bank portions comprises a first part, a distance from a surface of the first spacer structure away from the substrate towards the substrate is $d_1$, and a distance from a surface of the first part away from the substrate towards the substrate is $d_2$, where $d_1>d_2$.

In another aspect, some embodiments of the present disclosure further provide a display device, including a display panel. In some embodiments, the display panel includes: a substrate; light-emitting devices; a pixel definition layer, the light emitting devices and the pixel definition layer being located at a side of the substrate, and the pixel definition layer comprising: apertures comprising first apertures provided with the light-emitting devices and a second aperture, and bank portions; and a first spacer structure provided in the second aperture. Along a direction perpendicular to a plane of the substrate, one bank portion of the bank portions comprises a first part, a distance from a surface of the first spacer structure away from the substrate towards the substrate is $d_1$, and a distance from a surface of the first part away from the substrate towards the substrate is $d_2$, where $d_1>d_2$.

In another aspect, some embodiments of the present disclosure further provide a manufacturing method for a display panel. The display panel includes: a substrate; light-emitting devices; a pixel definition layer, the light emitting devices and the pixel definition layer being located at a side of the substrate, and the pixel definition layer comprising: apertures comprising first apertures provided with the light-emitting devices and a second aperture, and bank portions; and a first spacer structure provided in the second aperture. Along a direction perpendicular to a plane of the substrate, one bank portion of the bank portions comprises a first part, a distance from a surface of the first spacer structure away from the substrate towards the substrate is $d_1$, and a distance from a surface of the first part away from the substrate towards the substrate is $d_2$, where $d_1>d_2$. In some embodiments, the manufacturing method includes: forming the pixel definition layer having the first apertures, the second aperture, and the bank portions after exposure and development by using a halftone mask; and forming the first spacer structure in the second aperture.

BRIEF DESCRIPTION OF DRAWINGS

In order to better illustrate technical solutions in embodiments of the present disclosure or in the related art, the accompanying drawings used in the embodiments and in the related art are briefly introduced as follows. It should be noted that the drawings described as follows are merely part of the embodiments of the present disclosure, and other drawings can also be acquired by those skilled in the art without paying creative efforts.

DESCRIPTION OF EMBODIMENTS

In order to make the purpose, technical solutions, and advantages of the embodiments of the present disclosure be understandable, the technical solutions in the embodiments of the present disclosure are described in the following with reference to the accompanying drawings. It should be understood that the described embodiments are merely exemplary embodiments of the present disclosure, which shall not be interpreted as providing limitations to the present disclosure. All other embodiments obtained by those skilled in the art without creative efforts according to the embodiments of the present disclosure are within the scope of the present disclosure.

The terms used in the embodiments of the present disclosure are merely for the purpose of describing particular embodiments but not intended to limit the present disclosure. Unless otherwise noted in the context, the singular form expressions "a", "an", "the" and "said" used in the embodiments and appended claims of the present disclosure are also intended to represent plural form expressions thereof.

In order to solve the problems existing in the related art, some embodiments of the present disclosure provide a display panel. A first aperture and a second aperture are formed on a pixel definition layer, a light-emitting device is formed in the first aperture, a spacer structure is formed in the second aperture, and the spacer structure is utilized to increase paths between sub-pixels, so as to hinder lateral leakage between the sub-pixels and ameliorate undesirable lighting of the sub-pixels.

Figure 1:
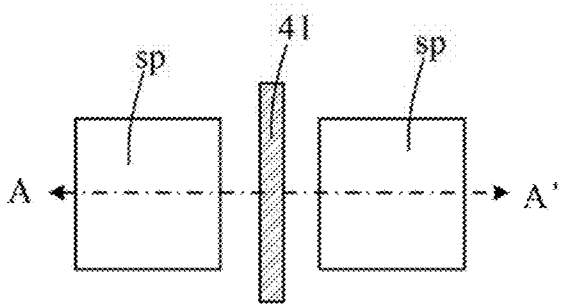
FIG. 1 is a partial top view of a display panel according to some embodiments of the present disclosure.
Figure 2:
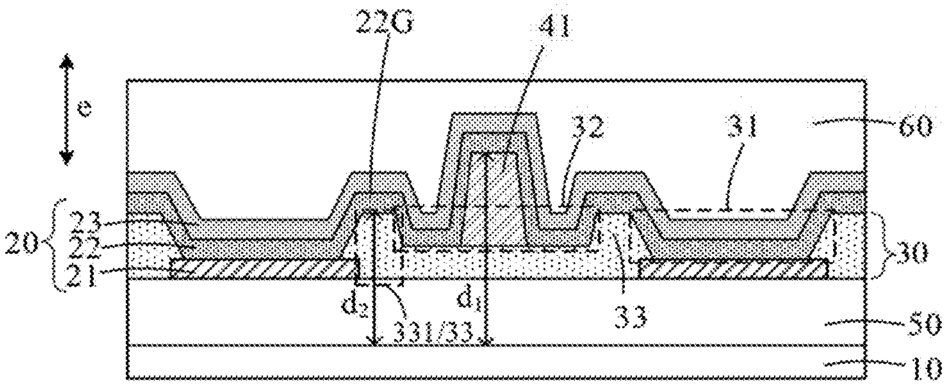
FIG. 2 is a schematic cross-sectional view at a tangent line A-A' shown in FIG. 1.
Figure 3:
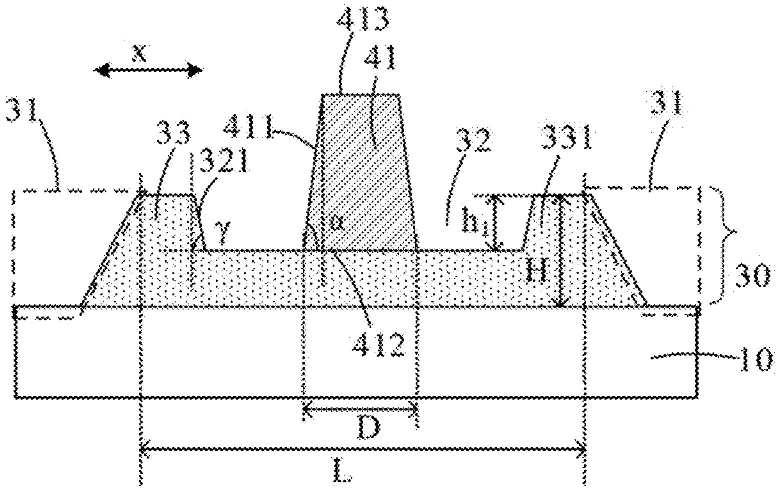
FIG. 3 is a partial enlarged view at a position of a first spacer structure in the display panel.

FIG. 1 is a partial top view of a display panel according to some embodiments of the present disclosure, FIG. 2 is a schematic cross-sectional view at a tangent line A-A' shown in FIG. 1, and FIG. 3 is a partial enlarged view at a position of a first spacer structure in the display panel. FIG. 1 illustrates two adjacent sub-pixels sp and a first spacer structure 41 located between the two sub-pixels sp in the display panel. The shape of the sub-pixel sp in FIG. 1 is schematically represented, not as a limitation on the present disclosure. The display panel includes sub-pixels sp, which at least include a red sub-pixel, a green sub-pixel, and a blue sub-pixel. The first spacer structure 41 is arranged between two sub-pixels sp to increase a transmission path of a lateral leakage current between the two sub-pixels sp.

As shown in FIG. 2, the display panel includes: a substrate 10, and a light-emitting device 20 and a pixel definition layer 30 that are located on one side of the substrate 10. The pixel definition layer 30 includes apertures and bank portions 33. The apertures include a first aperture 31 and a second aperture 32. A portion between adjacent apertures in the pixel definition layer 30 is the bank portion 33. The first aperture 31 is provided with the light-emitting device 20. The light-emitting device 20 serves as a sub-pixel sp of the display panel. The light-emitting device 20 includes a first electrode 21, a vapor deposition layer 22, and a second electrode 23 that are stacked. The first electrodes 21 are patterned structures separated from each other. The vapor deposition layer 22 includes an organic material, and the vapor deposition layer 22 is formed by vapor deposition with an open mask. The vapor deposition layers 22 corresponding to various light-emitting devices 20 are connected to each other to form a whole-surface structure, and the vapor deposition layers 22 serve as common layers 22G of the light-emitting devices 20. The second electrodes 23 of the light-emitting devices 20 are connected to each other, and the second electrodes 23 serve as common electrodes of the light-emitting devices 20. In some embodiments, the first electrode 21 is an anode, and the second electrode 23 is a cathode.

The first spacer structure 41 is arranged in the second aperture 32. Along a direction e perpendicular to a plane where the substrate 10 is located, a distance between a surface of the first spacer structure 41 away from the substrate 10 and the substrate 10 is $d_1$, the bank portion 33 includes a first part 331, and a distance between a surface of the first part 331 away from the substrate 10 and the substrate 10 is $d_2$, where $d_1>d_2$. In other words, taking the substrate 10 as a reference plane, the surface on the side of the first spacer structure 41 away from the substrate 10 is higher than the surface on the side of the first part 331 away from the substrate 10.

As shown in FIG. 2, the display panel further includes a driving layer 50 and a packaging layer 60. The driving layer 50 is located between the substrate 10 and the light-emitting device 20. The driving layer 50 is provided with a pixel circuit. The pixel circuit is configured to drive the light-emitting device 20 to emit light. The packaging layer 60 is located on one side of the light-emitting device 20 away from the substrate 10. The packaging layer 60 is configured to package and protect the light-emitting device 20, so as to prolong the service life of the light-emitting device 20. In some embodiments, the packaging layer 60 includes at least one inorganic layer and at least one organic layer.

Taking the bank portion 33 adjacent to the first aperture 31 as an example for illustration, the bank portion 33 includes a flat portion and a slope portion. An outer surface of the slope portion forms an inner wall of the first aperture 31. In other words, the slope portion and the first aperture 31 share a sidewall. The flat portion is a portion where the first part 331 of the bank portion 33 is located.

FIG. 3 only illustrates the first spacer structure 41 and the second aperture 32 where the first spacer structure 41 is located. As shown in FIG. 3, the first spacer structure 41 includes a side surface 411 and a bottom surface 412 located on one side of the substrate 10, and an angle α formed between the side surface 411 and the bottom surface 412 is an acute angle. The angle α may be considered as a gradient angle of the side surface 411 of the first spacer structure 41. The first spacer structure 41 further includes a top surface 413. The top surface 413 is a surface of the first spacer structure 41 away from the substrate 10. In some embodiments of the present disclosure, the first spacer structure 41 is located on one side of the common layer 22G close to the substrate 10. That is, the common layer 22G is formed after the first spacer structure 41 is formed. Referring to FIG. 2, the vapor-deposited common layer 22G may be deposited along the top surface 413 and the side surface 411 of the first spacer structure 41, and the first spacer structure 41 in the cross-sectional view is in a shape of a regular trapezoid. In some embodiments of the present disclosure, the packaging layer 60 is formed on the side of the light-emitting device 20 away from the substrate 10. In the manufacturing of the packaging layer 60, the inorganic layer in the packaging layer 60 may be deposited by adapting to the shape of the first spacer structure 41. The first spacer structure 41 is in the cross-sectional view is in a shape of a regular trapezoid, such that the inorganic layer in the packaging layer 60 can be well deposited at corresponding positions of the top surface 413 and the side surface 411 of the first spacer structure 41. In this way, partially thinning or fracture will not occur, thereby ensuring reliability of the packaging.

As shown in FIG. 3, an acute angle γ is formed between a sidewall 321 of the second aperture 32 and a plane parallel to the plane where the substrate 10 is located. Assuming that the pixel definition layer 30 does not include the second aperture 32 and the first spacer structure 41, a portion between two first apertures 31 is usually a flat portion of the pixel definition layer 30, and the common layer G22 formed on the pixel definition layer 30 may be deposited directly in the flat portion. In this case, a lateral distance between two first apertures 31 is L, and a length of the transmission path of the lateral leakage current between two adjacent sub-pixels in the common layer 22G is L.

In some embodiments of the present disclosure, the pixel definition layer 30 includes the second aperture 32, and the first spacer structure 41 is arranged in the second aperture 32, so there are undulations in the portion between the two first apertures 31. In this case, the common layer 22G may be deposited on an undulating surface between the two first apertures 31. The common layer 22G may be deposited on the sidewall 321 of the second aperture 32 and the side surface 411 of the first spacer structure 41. The common layer 22G deposited on the sidewall 321 of the second aperture 32 and the side surface 411 of the first spacer structure 41 can increase a transmission path of the lateral leakage current in the common layer 22G. Compared with a case where the second aperture 32 and the first spacer structure 41 are not provided, a path length that can be increased is $2*(L_{411}-L_{411}*\cos\alpha)+2*(L_{321}-L_{321}*\cos\gamma)$ in the embodiments of the present disclosure, where $L_{411}$ denotes a length of the side surface 411 of the first spacer structure 41, $2*(L_{411}-L_{411}*\cos\alpha)$ denotes a path length increased after the arrangement of the first spacer structure 41, $L_{321}$ denotes a length of the sidewall 321 of the second aperture 32, and $2*(L_{321}-L_{321}*\cos\gamma)$ denotes a path length increased after the arrangement of the second aperture 32. In some embodiments of the present disclosure, $d_1>d_2$, and the surface of the first spacer structure 41 away from the substrate 10 is higher than the surface of the first part 331 of the bank portion 33 away from the substrate 10, such that the length of the side surface 411 of the first spacer structure 41 is greater than the length of the sidewall 321 of the second aperture 32, and the first spacer structure 41 makes a relatively great contribution to the effect of increasing the path.

In the display panel according to some embodiments of the present disclosure, the pixel definition layer 30 includes the first aperture 31, the second aperture 32, and the bank portion 33, the light-emitting device 20 is arranged in the first aperture 31, and the first spacer structure 41 is arranged in the second aperture 32. Restricted by a thickness of the pixel definition layer 30, a depth of the second aperture 32 is limited, and a length of the sidewall 321 of the corresponding second aperture 32 is limited, and thus the transmission path of the lateral leakage current increased by the sidewall 321 of the second aperture 32 is limited. In some embodiments of the present disclosure, $d_1>d_2$, and the surface of the first spacer structure 41 away from the substrate 10 is higher than the surface of the first part 331 of the bank portion 33 away from the substrate 10, so that the length of the side surface 411 of the first spacer structure 41 is greater than the length of the sidewall 321 of the second aperture 32, the effect on increasing the transmission path of the lateral leakage current by the first spacer structure 41 is not limited by the thickness of the pixel definition layer 30, and the transmission path of the lateral leakage current can be greatly increased by using the side surface 411 of the first spacer structure 41. In some embodiments of the present disclosure, both the side surface 411 of the first spacer structure 41 and the sidewall 321 of the second aperture 32 can increase the transmission path of the lateral leakage current in the common layer 22G, thereby hindering transmission of the lateral leakage current and ameliorating undesirable lighting of the sub-pixels. In addition, both the side surface 411 of the first spacer structure 41 and the sidewall 321 of the second aperture 32 are slope surfaces, and the common layer 22G vapor-deposited on the slope surface may be relatively thin, which can further increase impedance of the common layer 22G and can also reduce the leakage current and ameliorate undesirable lighting of the sub-pixels.

With reference to the description in the embodiments of FIG. 3, the increased path length after the arrangement of the first spacer structure 41 is $2*(L_{411}-L_{411}*\cos\alpha)$. When a height h of the first spacer structure 41 is determined, $2*(L_{411}-L_{411}*\cos\alpha)=2*h*(1/\sin\alpha-1/\tan\alpha)=2*h*(1-\cos\alpha)/\sin\alpha$. On the whole, the greater a is, the greater $2*h*(1-\cos\alpha)/\sin\alpha$ is. In some embodiments, $60°\leq\alpha<90°$, and the transmission path of the leakage current increases greatly after the arrangement of the first spacer structure 41, which can greatly hinder the transmission of the lateral leakage current and ameliorate the undesirable lighting of the sub-pixels.

Figure 4:
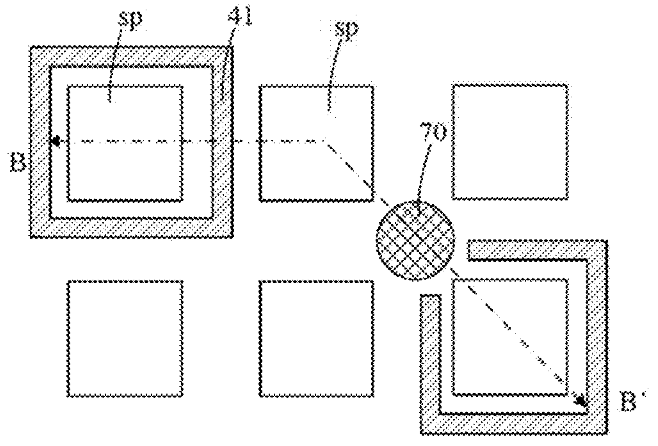
FIG. 4 is a schematic diagram of another display panel according to some embodiments of the present disclosure.
Figure 5:
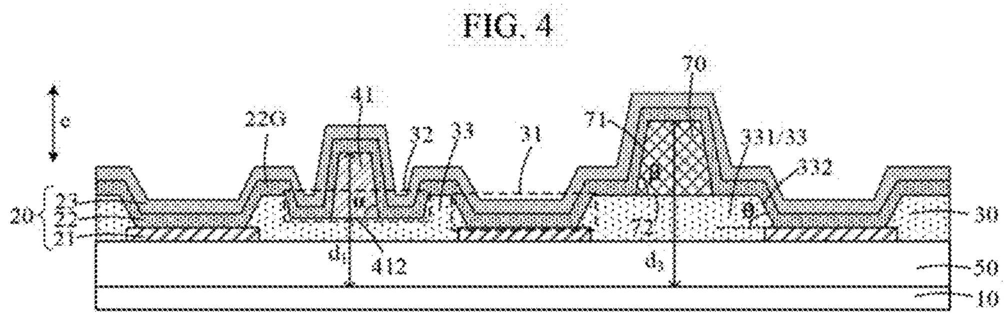
FIG. 5 is a schematic cross-sectional view at a tangent line B-B' shown in FIG. 4.

In some embodiments, FIG. 4 is a schematic diagram of another display panel according to some embodiments of the present disclosure. FIG. 5 is a schematic cross-sectional view at a tangent line B-B' shown in FIG. 4. FIG. 4 illustrates a plurality of sub-pixels sp in the display panel, and the first spacer structure 41 is provided between at least two adjacent sub-pixels sp. In FIG. 4, the arrangement of the sub-pixels sp and arrangement positions of the support post 70 and the first spacer structures 41 are merely schematically represented, not as a limitation on the present disclosure.

Referring to FIG. 4 and FIG. 5, the display panel further includes a support post 70, and the support post 70 is located on the side of the first part 331 away from the substrate 10. Along the direction e perpendicular to the plane where the substrate 10 is located, a distance between a surface of the support post 70 away from the substrate 10 and the substrate 10 is $d_3$, where $d_3>d_1$. In other words, taking the substrate 10 as a reference plane, the surface of the support post 70 away from the substrate 10 is higher than the surface of the first spacer structure 41 away from the substrate 10, so the support post 70 can be configured to support a mask in the process of vapor-depositing the common layer, to prevent contact between the mask in the vapor deposition process and the first spacer structure 41. In some embodiments of the present disclosure, the first spacer structure 41 is mainly configured to increase the transmission path of the lateral leakage current between two adjacent sub-pixels. The first spacer structure 41 can be arranged between sub-pixels sp in a specific color or between any two adjacent sub-pixels sp in the panel, and a total area of the first spacer structure 41 is relatively large when considering an entire display panel. In the vapor deposition process, if the mask is in contact with the large-area first spacer structure 41, scratches may occur between the mask and the first spacer structure 41, and scraped residues of the mask may fall to the panel in next vapor deposition, resulting in poor vapor deposition. In the embodiments of the present disclosure, the surface of the support post 70 away from the substrate 10 is higher, so that the support post 70 can support the mask, thereby preventing poor vapor deposition and improving a vapor deposition yield.

In some embodiments, the support post 70 and the first spacer structure 41 are formed by a same material. The material of the support post 70 and the first spacer structure 41 includes an organic material. In some embodiments, the support post 70 and the first spacer structure 41 are formed by using a positive photoresist through an exposure-development process. The first spacer structure 41 and the support post 70 are formed in a same process, which can simplify the process and make the process simple.

In some embodiments, as shown in FIG. 5, the support post 70 includes a first sidewall 71 and a first bottom surface 72, the first bottom surface 72 is a surface of the support post 70 close to the substrate 10, and an angle between the first sidewall 71 and the first bottom surface 72 is $\beta$. The angle $\beta$ may be considered as an gradient angle of the first sidewall 71 of the support post 70. In some embodiments of the present disclosure, $\beta<\alpha$. The angle $\alpha$ shown in FIG. 5 can be understood with reference to the embodiments in FIG. 3. The support post 70 and the first spacer structure 41 have different functions, so there are differences in terms of their sizes and shapes. In some embodiments of the present disclosure, $\beta<\alpha$, thus a width of the first bottom surface 72 of the support post 70 is greater than a width of the bottom surface 412 of the first spacer structures 41 when the support post 70 and the first spacer structure 41 are formed in a same exposure-development process. In this way, the support post 70 can have a relatively large area to effectively support the mask, and the first spacer structure 41 can have a relatively small width to minimize occupation of a space between two adjacent sub-pixels and prevent an influence on the arrangement density of the sub-pixels in the display panel.

In some embodiments, as shown in FIG. 5, the bank portion 33 includes a second sidewall 332, and the bank portion 33 and the first aperture 31 share the second sidewall 332. The second sidewall 332 of the bank portion 33 is an inner wall of the first aperture 31. An angle formed between the second sidewall 332 and a plane parallel to the plane where the substrate 10 is located and pointing to the bank portion 33 is $\theta$. The angle $\theta$ may be considered as a gradient angle of the second sidewall 332. In some embodiments of the present disclosure, $\theta<\beta$. In some embodiments of the present disclosure, the bank portion 33 is formed first, and then the support post 70 and the first spacer structure 41 are formed. On the one hand, the support post 70 is formed above the bank portion 33, and a width of the support post 70 is smaller than a width of the bank portion 33 between two first apertures 31. Since the wider bank portion 33 may have a larger gradient angle due to the influence of the exposure-development process, $\theta<\beta$. On the other hand, the second sidewall 332 is the inner wall of the first aperture 31, the light-emitting device is arranged in the first aperture 31, and the second sidewall 332 has a smaller gradient angle, so that the second sidewall 332 has a larger length when the thickness of the bank portion 33 is determined. In this way, it can ensure light output of the light-emitting device at a large angle and prevent color cast at the large angle.

In some embodiments, the pixel definition layer 30 and the first spacer structure 41 are formed by a same material, and both the pixel definition layer 30 and the first spacer structure 41 are formed by using a positive photoresist through an exposure-development process. The first spacer structure 41 is formed in the second aperture 32 formed in the pixel definition layer 30, thereby achieving better adhesion between the first spacer structure 41 and a structure below it and saving material costs by using a same material for manufacturing. When the pixel definition layer 30 and the first spacer structure 41 are formed by a same material, although their manufacturing processes are sequential, there is no obvious boundary at a position where the two contact each other after the final formation. Moreover, since the first spacer structure 41 is formed in the second aperture 32 of the pixel definition layer 30 and $d_1>d_2$, there may be certain depressions (considered as the interior of the second aperture 32) at left and right sides of the first spacer structure 41, then the first spacer structure 41 and the pixel definition layer 30 can be distinguished.

In some embodiments, as shown in FIG. 3, in a direction x from the first aperture 31 to the first spacer structure 41, a width of the bottom surface 412 of the first spacer structure 41 is D, where 2 $\mu m \leq D \leq 10$ $\mu m$. When the first spacer structure 41 is formed by using an exposure-development process, due to the influence of the process, a certain relationship exists between the width D of the bottom surface 412 and the gradient angle $\alpha$ of the side surface 411. The smaller the width D, the larger the gradient angle $\alpha$, and the greater increase in the transmission path of the leakage current due to the first spacer structure 41. In some embodiments of the present disclosure, the width D of the bottom surface 412 is small, to ensure that the gradient angle $\alpha$ satisfies $60° \leq \alpha < 90°$, so that the transmission path of the leakage current is increased greatly after the arrangement of the first spacer structure 41. Moreover, the width D of the bottom surface 412 is not extremely small, so that a contact area between the first spacer structure 41 and the structure below it is large enough and the adhesion is good enough, and the first spacer structure 41 is not prone to peeling in the process after the first spacer structure 41. In addition, the width D of the bottom surface 412 is not extremely large, so that it can prevent the arrangement of the first spacer structure 41 from having an influence on the spacing distance between two adjacent sub-pixels. In some embodiments of the present disclosure, the limitation on the size of the width D ensures that the first spacer structure 41 can greatly increase the transmission path of the leakage current and ameliorate the lateral leakage, can also ensure the structural stability of the first spacer structure 41 and prevent the first spacer structure from peeling, and can also avoid an influence on the spacing distance between two sub-pixels to influence the arrangement density of the sub-pixels.

In some embodiments, as shown in FIG. 3, along the direction e perpendicular to the plane where the substrate 10 is located, a depth of the second aperture 32 is $h_1$, and a thickness of the first part is H, where $2*H/3 \leq h_1 \leq H$. With reference to the description of the principle of increasing the transmission path of the leakage current in the embodiments of FIG. 3, it is known that the sidewall 321 of the second aperture 32 is beneficial to increase the transmission path of the leakage current. When H is determined, the greater the depth $h_1$, the greater the increase in the transmission path of the leakage current. In some embodiments of the present disclosure, when $2*H/3 \leq h_1 \leq H$, the transmission path of the leakage current can be increased greatly due to the sidewall 321 of the second aperture 32, so as to hinder the transmission of the leakage current and ameliorate undesirable lighting of the sub-pixels.

In some embodiments, $h_1=H$. That is, the second aperture 32 runs through the pixel definition layer 30 in a thickness direction of the pixel definition layer 30. In this way, the sidewall 321 of the second aperture 32 greatly increases the transmission path of the leakage current, thereby bringing a better effect in terms of ameliorating undesirable lighting of the sub-pixels.

In some embodiments, the first part 331 of the bank portion 33 is a portion having a maximum thickness in the pixel definition layer 33. The thickness H of the first part 331 satisfies 0.8 μm≤H≤2 μm.

In some embodiments, as shown in FIG. 2, the first electrode 21 of the light-emitting device 20 is located on one side of the pixel definition layer 30 close to the substrate 10. In the direction e perpendicular to the plane where the substrate 10 is located, the first aperture 31 overlaps with the first electrode 21, and the second aperture 32 does not overlap with the first electrode 21. In the embodiments, regardless of the depth of the second aperture 32, the bottom of the second aperture 32 does not expose the first electrode 21. Therefore, the flatness of the bottom of the second aperture 32 can be achieved, thereby preventing the first spacer structure 41 being formed on an uneven base, which would otherwise lead to tilt of the first spacer structure 41. The tilt of the first spacer structure 41 may cause cracks in the packaging layer in the subsequent packaging process to affect reliability. In some embodiments of the present disclosure, the tilt of the first spacer structure 41 can be prevented, so that the reliability of the packaging can be improved.

Figure 6:
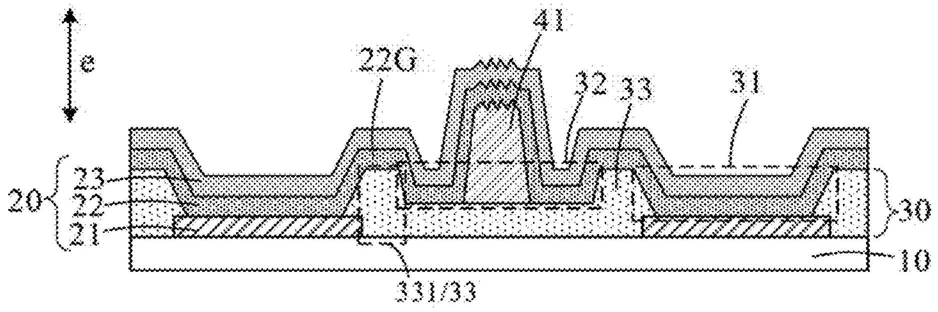
FIG. 6 is another schematic cross-sectional view at the tangent line A-A' shown in FIG. 1.

In some embodiments, FIG. 6 is another schematic cross-sectional view at the tangent line A-A' shown in FIG. 1. As shown in FIG. 6, a surface of the first spacer structure 41 away from the substrate 10 is a concave-convex surface, which can further increase the transmission path of the leakage current, thereby further hindering the transmission of the leakage current and ameliorating the undesirable lighting of the sub-pixels. In one or more embodiments, a base below the first spacer structure 41 is formed to have a surface in a concave-convex shape, so that the surface of the first spacer structure 41 away from the substrate 10 is a concave-convex surface after the first spacer structure 41 is formed on the concave-convex surface. In this way, it can increase a contact area between the first spacer structure 41 and the base below, thereby improving reliability of bonding between the two. In some other embodiments, the first spacer structure 41 is formed by using a halftone mask, and the surface of the first spacer structure 41 away from the substrate 10 is a concave-convex surface. The specific manufacturing method for the first spacer structure 41 will be illustrated in the following manufacturing method embodiments.

Figure 7:
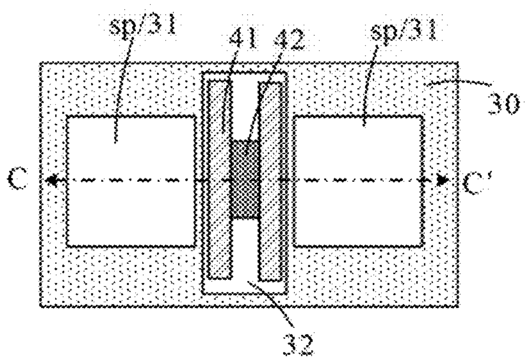
FIG. 7 is a schematic diagram of another display panel according to some embodiments of the present disclosure.
Figure 8:
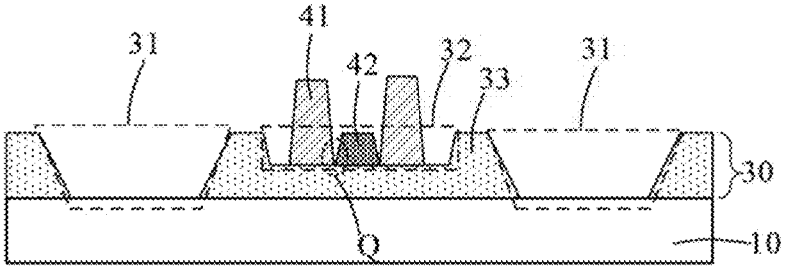
FIG. 8 is a schematic cross-sectional view at a tangent line C-C' in FIG. 7.

In some embodiments, FIG. 7 is a schematic diagram of another display panel according to some embodiments of the present disclosure, and FIG. 8 is a schematic cross-sectional view at a tangent line C-C' in FIG. 7. FIG. 7 illustrates the first aperture 31 and the second aperture 32 of the pixel definition layer 30. A position of the first aperture 31 is a position of the sub-pixel sp. FIG. 7 further illustrates a first spacer structure 41 and a second spacer structure 42 in the second aperture 32. The sub-pixel sp corresponds to the position of the first aperture 31 of the pixel definition layer 30, and the sub-pixel sp is not marked in FIG. 8. Referring to FIG. 7 and FIG. 8, the display panel further includes a second spacer structure 42, and the second spacer structure 42 is arranged in the second aperture 32. It can be understood that the second spacer structure 42 is the same as the first spacer structure 41, and both of them are protruding structures in the second aperture 32. The second spacer structure 42 is not an inner wall of the second aperture 32. The second aperture 32 has a bottom surface, and the second spacer structure 42 protrudes upwards from a plane where the bottom surface of the second aperture 32 is located.

In some embodiments, the first spacer structure 41, the second spacer structure 42, and the pixel definition layer 30 are formed by a same material. Since $d_1>d_2$, the first spacer structure 41 in the second aperture 32 can be easily identified. When the second spacer structure 42 and the pixel definition layer 30 are formed by a same material, there is no clear boundary between the second spacer structure 42 and the bottom surface of the second aperture 32. In some embodiments, when the second spacer structure 42 and the second aperture 32 are formed in a same process, the second spacer structure 42 and the second aperture 32 are integrally formed, so there is no clear boundary between the second spacer structure 42 and the bottom surface of the second aperture 32. The second spacer structure 42 in the second aperture 32 may be defined in the following manner. For example, FIG. 7 illustrates a strip-shaped second aperture 32 between two sub-pixels sp. In FIG. 7, the length of the second spacer structure 42 is relatively small in a longitudinal direction. In this case, the second spacer structure 42 is the protruding structure in the second aperture 32, and a chamber space of the second aperture 32 is around the second spacer structure 42. In this case, it is easy to distinguish the second spacer structure 42 from the inner wall of the second aperture 32. When the second spacer structure 42 is in contact with the inner wall of the second aperture 32 in the longitudinal direction in FIG. 7, regardless of the height of the surface of the second spacer structure 42 away from the substrate 10, it can be considered that the second spacer structure 42 divides the second aperture 32 into smaller apertures in an extension direction thereof. For example, when one second spacer structure 42 is arranged in the second aperture 32 in FIG. 7, the second spacer structure 42 extending longitudinally may divide the second aperture 32 into two small apertures.

As shown in a region Q circled in FIG. 8, two opposite side surfaces of the first spacer structure 41 and the second spacer structure 42 intersect each other. In this case, a slit with a small volume and tends to be V-shaped is formed between the two opposite side surfaces of the first spacer structure 41 and the second spacer structure 42. When forming the common layer, a stress concentration point may exist when the common layer is deposited at the slit, as a result, the common layer may naturally fracture at the slit to form a disconnection region of the common layer. The leakage current cannot flow laterally in the disconnection region of the common layer, thereby blocking lateral leakage between adjacent sub-pixels, which can ameliorate the undesirable lighting of the sub-pixels.

As shown in FIG. 8, the surface of the first spacer structure 41 away from the substrate 10 and the surface of the second spacer structure 42 away from the substrate 10 have different heights, and the surface of the first spacer structure 41 away from the substrate 10 is higher than the surface of the second spacer structure 42 away from the substrate 10.

In some embodiments, the first spacer structure 41 and the second spacer structure 42 are formed in a same process, and the first spacer structure 41 and the second spacer structure 42 are simultaneously formed after exposure-development by using a half-tone mask.

In some other embodiments, the second spacer structure 42 and the bank portion 33 are formed in a same process. That is, the second spacer structure 42 is formed in the process of manufacturing the pixel definition layer 30, and a distance between the surface of the second spacer structure 42 away from the substrate 10 and the substrate 10 is equal to $d_2$.

In some embodiments of the present disclosure, the first spacer structure 41 is located between two adjacent first apertures 31 and configured to increase the transmission path of the lateral leakage current between two sub-pixels. A number of the first spacer structure 41 between the two adjacent first apertures 31 may be set according to actual requirements. FIG. 7 illustrates that two first spacer structures 41 are arranged between the two adjacent first apertures 31. In some other embodiments, one or more first spacer structures 41 may be arranged between the two adjacent first apertures 31 as required.

In some embodiments of the present disclosure, a number of the second spacer structure 42 arranged in the second aperture 32 is not limited. FIG. 7 illustrates that one second spacer structure 42 is arranged in the second aperture 32. In some embodiments, in FIG. 7, the second aperture 32 is provided with two or more discontinuous second spacer structures 42 in the longitudinal direction.

Figure 9:
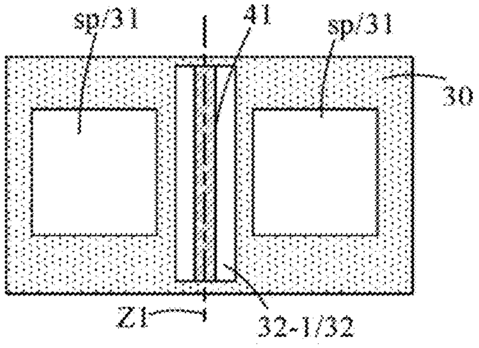
FIG. 9 is a schematic diagram of another display panel according to some embodiments of the present disclosure.

In some embodiments, FIG. 9 is a schematic diagram of another display panel according to some embodiments of the present disclosure. FIG. 9 illustrates two sub-pixels sp. One sub-pixel sp corresponds to one first aperture 31. As shown in FIG. 9, the second aperture 32 includes a first sub-aperture 32-1, and the first sub-aperture 32-1 is located between two adjacent first apertures 31. A first midline Z1 exists between two adjacent first apertures 31, and minimum distances from the first midline Z1 to the two first apertures 31 are equal to each other. The first midline Z1 is a virtual line between the two first apertures 31. The minimum distance from the first midline Z1 to the first aperture 31 may be understood with reference to the above embodiments in FIG. 5. The first aperture 31 has an inner wall, the second sidewall 332 of the bank portion 33 is the inner wall of the first aperture 31, and a minimum distance from the first midline Z1 to the inner wall of the first aperture 31 is the minimum distance from the first midline Z1 to the first aperture 31. In some embodiments of the present disclosure, the first midline Z1 is a middle position between the two first apertures 31. The first sub-aperture 32-1 overlaps with the first midline Z1, indicating that the first sub-aperture 32-1 is roughly located at a middle position between the two first apertures 31. The first spacer structure 41 is formed in the first sub-aperture 32-1 to increase the transmission path of the leakage current between the two first apertures 31. With such a configuration, when one or more first spacer structures 41 having a suitable size are formed in the first sub-aperture 32-1, the first sub-aperture 32-1 can have a safe distance to each of the two first apertures 31, so that the bank portion 33 between the first sub-aperture 32-1 and the first aperture 31 has a flat portion with a certain length (see the corresponding description about the bank portion 33 in the embodiments of FIG. 2). In this way, integrity of the inner wall of the first aperture 31 can be ensured, thereby ensuring a yield of the light-emitting device 20 formed in the first aperture 31.

Figure 10:
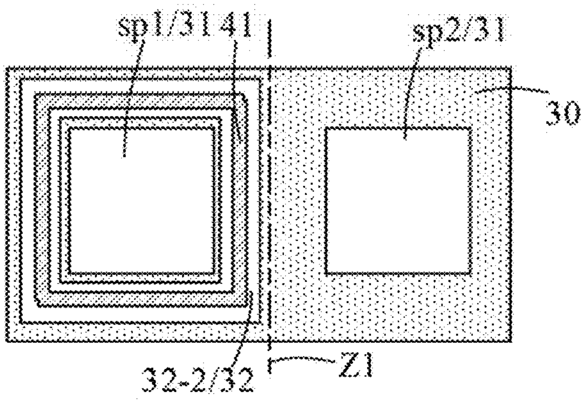
FIG. 10 is a schematic diagram of another display panel according to some embodiments of the present disclosure.

In some embodiments, FIG. 10 is a schematic diagram of another display panel according to some embodiments of the present disclosure. FIG. 10 illustrates two sub-pixels, which are a first sub-pixel sp1 and a second sub-pixel sp2, respectively. One sub-pixel corresponds to one first aperture 31. As shown in FIG. 10, the second aperture 32 includes a second sub-aperture 32-2, and part of the second sub-aperture 32-2 is located between two adjacent first apertures 31. A first midline Z1 exists between two adjacent first apertures 31, and minimum distances from the first midline Z1 to the two first apertures 31 are equal to each other. The first midline Z1 may be understood with reference to the related description in the above embodiments of FIG. 9. The second sub-aperture 32-2 is located on one side of the first midline Z1, and the first spacer structure 41 arranged in the second sub-aperture 32-2 is also located on one side of the first midline Z1. FIG. 10 illustrates that the second sub-aperture 32-2 between two first apertures 31 is closer to the left first aperture 31. Then, the transmission path of the leakage current is increased by using the second sub-aperture 32-2 and the first spacer structure 41, thereby hindering the transmission of the leakage current towards the left first sub-pixel sp1, to prevent undesirable lighting of the first sub-pixel sp1.

In some embodiments, as shown in FIG. 10, the second sub-aperture 32-2 is arranged around the first aperture 31, and the first spacer structure 41 in the second sub-aperture 32-2 is arranged around the first aperture 31, which can hinder the transmission of the leakage current around the first sub-pixel sp1 and effectively prevent the undesirable lighting of the first sub-pixel sp1.

In some embodiments of the present disclosure, the light-emitting device 20 includes at least a red light-emitting device, a green light-emitting device, and a blue light-emitting device. Light-emitting layers in the light-emitting devices in different colors are formed by different materials, and turn-on voltages of the light-emitting devices are different, so degrees to which the light-emitting devices are affected by the leakage current are different. For example, the turn-on voltage of the blue light-emitting device is lower, so the blue light-emitting device is greatly affected by the lateral leakage current, and the blue light-emitting device is prone to undesirable lighting. In the display panel, the first spacer structures 41 around the light-emitting devices can be differentiated according to the differences in the degrees of influence by the leakage current.

Figure 11:
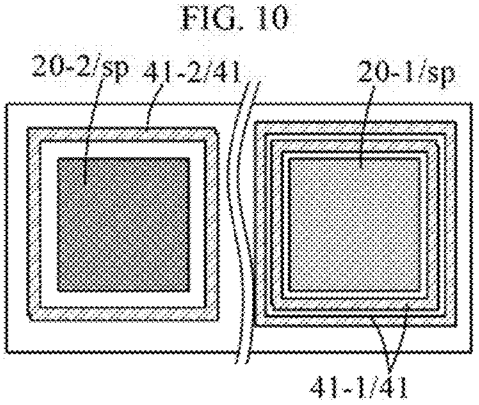
FIG. 11 is a schematic diagram of another display panel according to some embodiments of the present disclosure.

In some embodiments, FIG. 11 is a schematic diagram of another display panel according to some embodiments of the present disclosure. FIG. 11 illustrates a first light-emitting device 20-1 and a second light-emitting device 20-2 in different colors. The first light-emitting device 20-1 and the second light-emitting device 20-2 may be adjacent or non-adjacent. Both the first light-emitting device 20-1 and the second light-emitting device 20-2 are sub-pixels sp in the display panel. Each light-emitting device corresponds to one first aperture (not marked in FIG. 11). The first spacer structure 41 includes a type-A first spacer structure 41-1 and a type-B first spacer structure 41-2. The type-A first spacer structure 41-1 is arranged around the first light-emitting device 20-1, and the type-B first spacer structure 41-2 is arranged around the second light-emitting device 20-2. The type-A first spacer structure 41-1 and the type-B first spacer structure 41-2 are different in number. In some embodiments, as shown in FIG. 11, the number of the type-A first spacer structure 41-1 is greater than that of the type-B first spacer structure 41-2. The more the first spacer structures 41 are arranged around the light-emitting device, the greater the increase in the transmission path of the leakage current, bringing a greater effect in terms of hindering the transmission of the leakage current. When the first light-emitting device 20-1 is more susceptible to the leakage current than the second light-emitting device 20-2, more type-A first spacer structures 41-1 may be arranged around the first light-emitting device 20-1, so as to greatly hinder the transmission of the leakage current around the first light-emitting device 20-1 to the first light-emitting device 20-1, thereby effectively ameliorating undesirable lighting of the first light-emitting device 20-1. In some embodiments of the present disclosure, the first spacer structures 41 around the light-emitting devices can be differentiated according to the differences in the degrees of influence by the leakage current. A greater number of first spacer structures 41 may be arranged around the light-emitting devices that are easily affected by the leakage current, and a smaller number of first spacer structures 41 or no first spacer structure 41 may be arranged around the light-emitting devices that are less affected by the leakage current. The reasonable setting of the number of the first spacer structure 41 can ameliorate the undesirable lighting of the sub-pixels and can also prevent the influence of redundancy of the first spacer structure 41 on a distance between the sub-pixels.

In some embodiments, in FIG. 11, the first light-emitting device 20-1 is a blue light-emitting device, and the second light-emitting device 20-2 is a red light-emitting device or green light-emitting device.

With reference to the schematic cross-sectional view shown in FIG. 3, along the direction e perpendicular to the plane where the substrate 10 is located, the first spacer structure 41 has a height. The height of the first spacer structure 41 is a vertical distance between the top surface 413 and the bottom surface 412. The height of the first spacer structure 41 may affect an increase in the transmission path of the leakage current. In some embodiments, for a first light-emitting device 20-1 and a second light-emitting device 20-2 in different colors, the type-A first spacer structure 41-1 is arranged around the first light-emitting device 20-1, and the type-B first spacer structure 41-2 is arranged around the second light-emitting device 20-2. The type-A first spacer structure 41-1 and the type-B first spacer structure 41-2 are different in height. When gradient angles α of the type-A first spacer structure 41-1 and the type-B first spacer structure 41-2 are equal to each other, a greater height indicates a greater increase in the transmission path of the leakage current and a further hindrance to the transmission of the leakage current. The heights of the type-A first spacer structure 41-1 and the type-B first spacer structure 41-2 around the light-emitting devices may be differentiated according to the differences in the degrees of influence by the leakage current. The reasonable setting of the heights of the first spacer structures around the light-emitting devices in different colors ameliorates the undesirable lighting of the sub-pixels.

Referring to FIG. 3, in the direction from the first aperture 31 to the first spacer structure 41, the bottom surface 412 of the first spacer structure 41 has a width D. The first spacer structure 41 is formed by using an exposure-development process. When the height of the first spacer structure 41 is determined, limited by the process, a certain correlation exists between the width D of the first spacer structure 41 and the gradient angle α of the side surface 411. A smaller width D indicates a larger gradient angle α and a greater increase in the transmission path of the leakage current by the first spacer structure 41. In some embodiments, for a first light-emitting device 20-1 and a second light-emitting device 20-2 in different colors, the type-A first spacer structure 41-1 is arranged around the first light-emitting device 20-1, and the type-B first spacer structure 41-2 is arranged around the second light-emitting device 20-2. The widths D of the type-A first spacer structure 41-1 and the type-B first spacer structure 41-2 are different from each other. When heights of the type-A first spacer structure 41-1 and the type-B first spacer structure 41-2 are equal to each other while the widths D of the two are different to each other, the gradient angles α of the two are different form each other and the corresponding increases in the transmission path of the leakage current by the two are different. The widths D of the type-A first spacer structure 41-1 and the type-B first spacer structure 41-2 around the light-emitting devices may be differentiated according to the differences in the degrees of influence by the leakage current. The reasonable setting of the widths D of the first spacer structures around the light-emitting devices in different colors ameliorates the undesirable lighting of the sub-pixels.

In some embodiments of the present disclosure, the type-A first spacer structure 41-1 is arranged around the first light-emitting device 20-1, and the type-B first spacer structure 41-2 is arranged around the second light-emitting device 20-2. The type-A first spacer structure 41-1 and the type-B first spacer structure 41-2 are different in at least one of height, width, and number, so that the first spacer structures 41 around the light-emitting devices can be differentiated according to the differences in the degrees of influence by the leakage current, and the height, the width, and the number of the first spacer structures 41 can be flexibly set to hinder the transmission of the lateral leakage current to ameliorate the undesirable lighting of the sub-pixels.

Through the above-described embodiments, it can be known that the first spacer structure 41 in the embodiments of the present disclosure has at least the features of height, number, and width. In some embodiments, degrees of the lateral leakage are different between the light-emitting devices in different colors. For example, the degree of leakage from the red light-emitting device to the blue light-emitting device is greater than that from the green light-emitting device to the blue light-emitting device. That is, the blue light-emitting device is easily affected by the red light-emitting device adjacent thereto to produce undesirable lighting. In this case, the first spacer structures 41 between the light-emitting devices can be differentiated according to different degrees of leakage.

Figure 12:
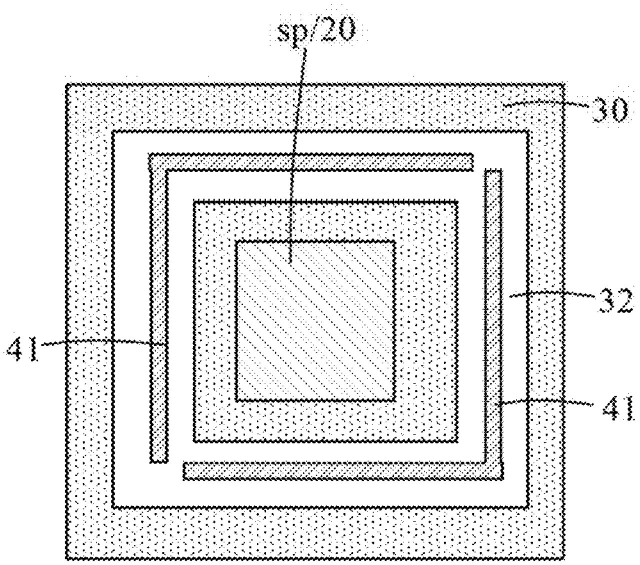
FIG. 12 is a schematic diagram of another display panel according to some embodiments of the present disclosure.

FIG. 11 illustrates that the first spacer structure 41 forms a closed ring around the light-emitting device. In some other embodiments, FIG. 12 is a schematic diagram of another display panel according to some embodiments of the present disclosure. FIG. 12 illustrates a location of a sub-pixel sp. The sub-pixel sp includes a light-emitting device 20. The light-emitting device 20 is arranged in the first aperture. As shown in FIG. 12, the second aperture 32 is arranged around the light-emitting device 20, the first spacer structure 41 is arranged around the light-emitting device 20, and two first spacer structures 41 are arranged around the light-emitting device 20. In the top view, the two first spacer structures 41 form a non-closed shape. When the first spacer structure 41 is arranged around the light-emitting device 20, a number of the first spacer structure 41 arranged around the light-emitting device 20 may be set according to a specific requirement.

Figure 13:
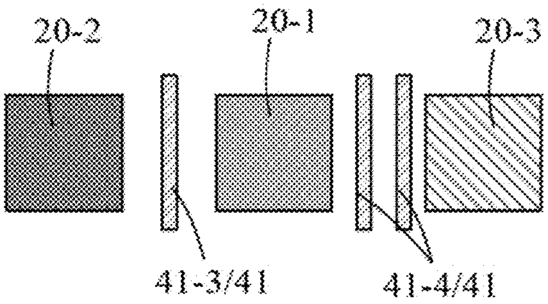
FIG. 13 is a schematic diagram of another display panel according to some embodiments of the present disclosure.

In some embodiments, FIG. 13 is a schematic diagram of another display panel according to some embodiments of the present disclosure. In FIG. 13, areas and arrangements of the light-emitting devices and the shape of the first spacer structure 41 are merely schematically illustrated, not as a limitation on the present disclosure. As shown in FIG. 13, the light-emitting device includes a first light-emitting device 20-1, a second light-emitting device 20-2, and a third light-emitting device 20-3 in colors different from one another, and the first spacer structure 41 includes a type-C first spacer structure 41-3 and a type-D first spacer structure 41-4. The type-C first spacer structure 41-3 is located between the first light-emitting device 20-1 and the second light-emitting device 20-2, and the type-D first spacer structure 41-4 is located between the first light-emitting device 20-1 and the third light-emitting device 20-3. The type-C first spacer structure 41-3 and the type-D first spacer structure 41-4 are different in at least one of height, width, and number. FIG. 13 illustrates that the type-C first spacer structure 41-3 and the type-D first spacer structure 41-4 are different only in number. The first light-emitting device 20-1 is adjacent to the second light-emitting device 20-2 and the third light-emitting device 20-3, and degrees of leakage from the second light-emitting device 20-2 and the third light-emitting device 20-3 to the first light-emitting device 20-1 are different. Features of the first spacer structures between adjacent light-emitting devices may be differentiated according to the differences in the degrees of leakage, so as to flexibly and reasonably set the heights, numbers, and widths of the first spacer structures to hinder lateral leakage between the light-emitting devices, which ameliorates the undesirable lighting of the sub-pixels.

FIG. 13 illustrates that the number of the type-D first spacer structure 41-4 is greater than that of the type-C first spacer structure 41-3. In one or more embodiments, the first light-emitting device 20-1 is a blue light-emitting device, the second light-emitting device 20-2 is a green light-emitting device, and the third light-emitting device 20-3 is a red light-emitting device.

Figure 14:
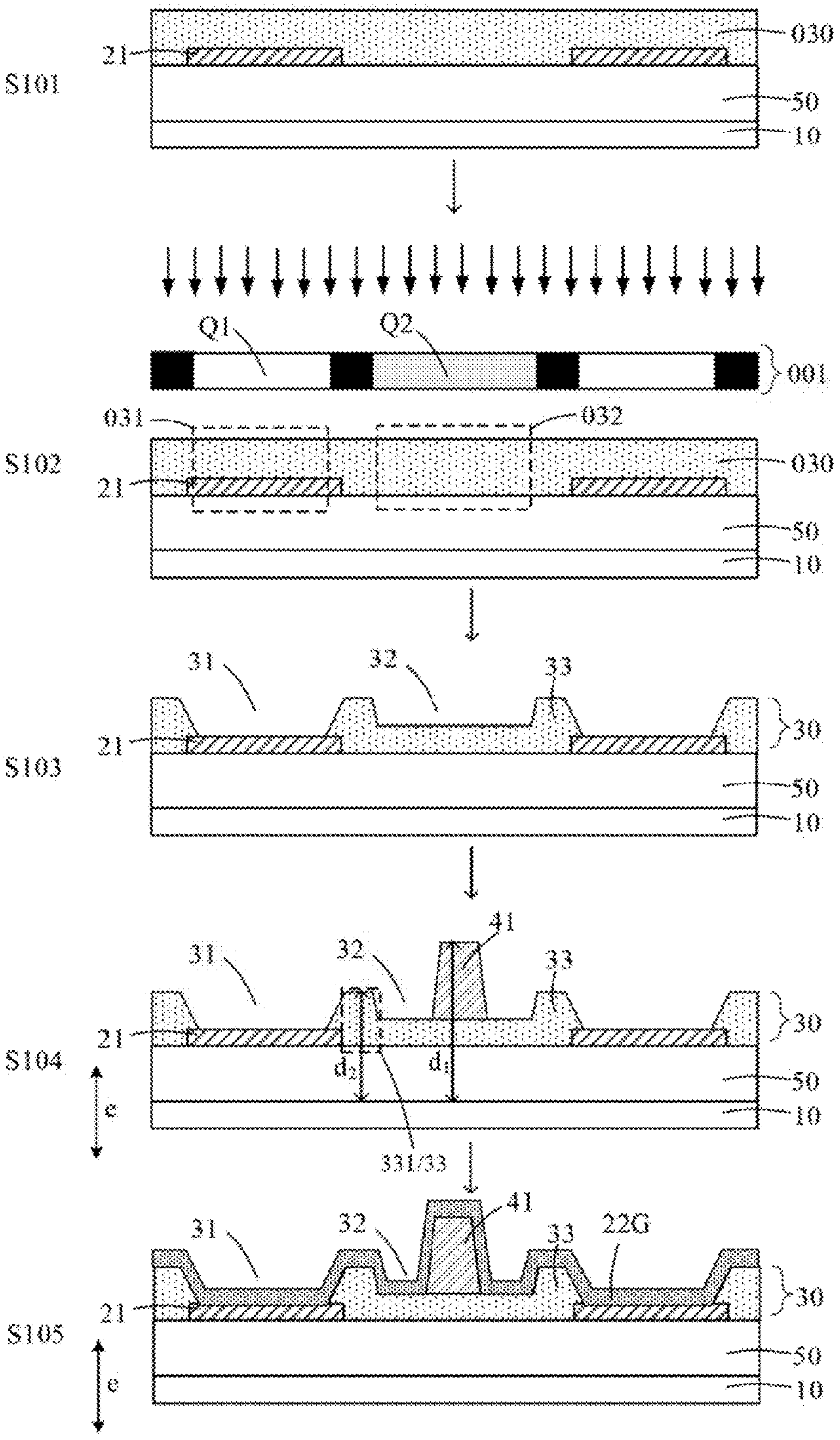
FIG. 14 is a flowchart of a manufacturing method for a display panel according to some embodiments of the present disclosure.

Based on a same inventive concept, some embodiments of the present disclosure further provide a manufacturing method for a display panel. The manufacturing method is used to manufacture the display panel according to the embodiments of the present disclosure. The embodiments of the display panel and the manufacturing method for the display panel can be understood by referring to each other. FIG. 14 is a flowchart of a manufacturing method for a display panel according to some embodiments of the present disclosure. As shown in FIG. 14, the manufacturing method includes the following steps.

A driving layer 50 is formed on a substrate 10, and a patterned first electrode 21 is formed on the driving layer 50. The first electrode 21 belongs to a light-emitting device. The manufacturing method includes the following steps after the first electrode 21 is formed.

In step S101, a first photoresist layer 030 is coated, the first photoresist layer 030 being configured to form a pixel definition layer 30. A material of the first photoresist layer 030 is positive photoresist.

In step S102, the first photoresist layer 030 is exposed by using a halftone mask 001. The halftone mask 001 has a first light transmission region Q1 and a second light transmission region Q2, the first light transmission region Q1 corresponds to a preset position 031 of a first aperture 31, and the second light transmission region Q2 corresponds to a preset position 032 of a second aperture 32.

In step S103, after development, the pixel definition layer 30 having the first aperture 31, the second aperture 32, and a bank portion 33 is formed. The first aperture 31 overlaps with the first electrode 21. In some embodiments, light transmittance of the first light transmission region Q1 is greater than that of the second light transmission region Q2, and a depth of the second aperture 32 formed after exposure-development is less than that of the first aperture 31.

In step S104, a first spacer structure 41 is formed in the second aperture 32, along a direction e perpendicular to a plane where the substrate 10 is located, a distance from a surface of the first spacer structure 41 away from the substrate 10 to the substrate 10 is $d_1$, the bank portion 33 includes a first part 331, and a distance from a surface of the first part 331 away from the substrate 10 to the substrate 10 is $d_2$, where $d_1>d_2$.

In step S105, a common layer 22G is vapor-deposited. The common layer 22G is formed by using an open mask, covering an entire region of the display panel. The common layer 22G may be deposited in the first aperture 31 as well as deposited along a side surface of the first spacer structure 41 and a top surface thereof away from the substrate 10.

After the vapor deposition of the common layer 22G, a second electrode 23 of a light-emitting device 20 is formed. The first electrode 21, the common layer 22G, and the second electrode 23 stacked at the first aperture 31 form the light-emitting device 20. In some embodiments, a packaging layer of the display panel is formed after the second electrode 23 is formed.

Based on the manufacturing method according to some embodiments of the present disclosure, the pixel definition layer 30 having the first aperture 31, the second aperture 32, and the bank portion 33 is formed after an exposure-development process by using the halftone mask 001, the light-emitting device is formed in the first aperture 31, and the first spacer structure 41 is formed in the second aperture 32. Moreover, a surface of the first spacer structure 41 away from the substrate 10 is higher than a surface of the first part 331 of the bank portion 33 away from the substrate 10, so that a length of a side surface 411 of the first spacer structure 41 is greater than a length of a sidewall 321 of the second aperture 32. The first spacer structure 41 and the pixel definition layer 30 are formed in different processes, so the effect on increasing the transmission path of the lateral leakage current by the first spacer structure 41 is not limited by the thickness of the pixel definition layer 30, and the transmission path of the lateral leakage current can be greatly increased by using the side surface 411 of the first spacer structure 41. In some embodiments of the present disclosure, both the side surface 411 of the first spacer structure 41 and the sidewall of the second aperture 32 can play a role of increasing the transmission path of the lateral leakage current in the common layer 22G, thereby hindering transmission of the lateral leakage current and ameliorating undesirable lighting of sub-pixels. In addition, both the side surface 411 of the first spacer structure 41 and the sidewall 321 of the second aperture 32 are slope surfaces, and the common layer 22G vapor-deposited on the slope surface may be relatively thin, which can further increase impedance of the common layer 22G, and can also reduce the leakage current and ameliorate undesirable lighting of the sub-pixels.

Figure 15:
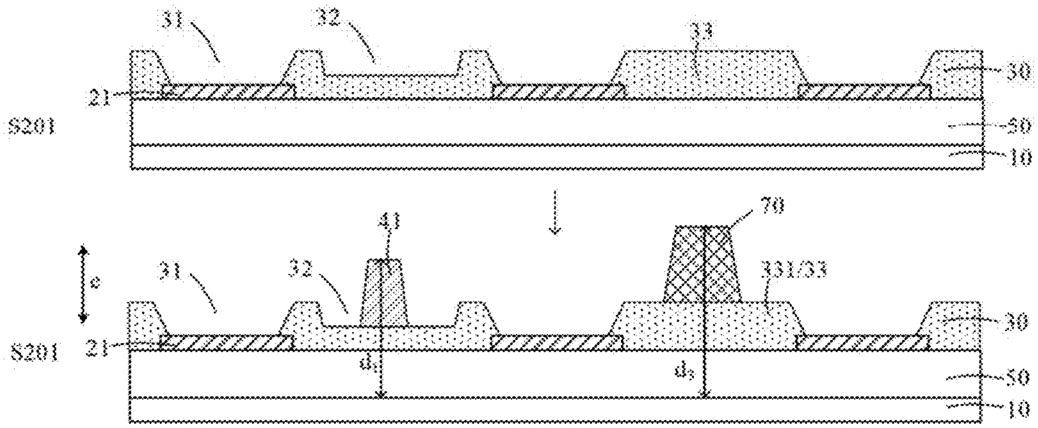
FIG. 15 is a flowchart of another manufacturing method for a display panel according to some embodiments of the present disclosure.

In some embodiments, the display panel further includes a support post. The first spacer structure 41 and the support post can be formed in a same process. FIG. 15 is a flowchart of another manufacturing method for a display panel according to some embodiments of the present disclosure. As shown in FIG. 15, the manufacturing method includes the following steps.

In step S201, after a first electrode 21 is formed, a pixel definition layer 30 having a first aperture 31, a second aperture 32, and a bank portion 33 is formed after exposure and development by using a halftone mask.

In step S202, a second photoresist layer is coated, and a first spacer structure 41 and a support post 70 are simultaneously formed by using an exposure-development process. Along a direction e perpendicular to a plane where a substrate 10 is located, a distance from a surface of the support post 70 away from the substrate 10 to the substrate 10 is $d_3$, where $d_3>d_1$. The first spacer structure 41 is located in the second aperture 32, and the support post 70 is located on one side of the first part 331 of the bank portion 33 away from the substrate 10. The second photoresist layer is configured to form the first spacer structure 41 and the support post. A material of the second photoresist layer is positive photoresist. The materials of the second photoresist layer and the first photoresist layer 030 may be the same or different. In some embodiments, the first spacer structure 41 has a height h, and the support post 70 has a height $h_{70}$, where $h<h_{70}$. This is because, although the first spacer structure 41 and the support post 70 are formed in a same process, the coated second photoresist layer cannot be completely leveled due to limitations of fluidity of the material of the second photoresist layer. The thickness of the second photoresist layer coated at the second aperture 32 may be relatively small, while the thickness of the second photoresist layer coated on the first part 331 of the bank portion 33 may be relatively large, so that after exposure and development, the first spacer structure 41 has a height slightly less than that of the support post 70.

A common layer G and other structures are formed after the first spacer structure 41 and the support post 70 are formed.

With the manufacturing method according to some embodiments of the present disclosure, the first spacer structure 41 and the support post 70 are formed in a same process, which can simplify the process. Moreover, the surface of the support post 70 away from the substrate 10 is higher than the surface of the first spacer structure 41 away from the substrate 10, so the support post 70 can be configured to support a mask in the process of vapor-depositing the common layer to prevent contact between the mask and the first spacer structure 41 during the vapor deposition process, thereby preventing poor vapor deposition and improving a vapor deposition yield.

In some embodiments, as shown in FIG. 6, a surface of the first spacer structure 41 away from the substrate 10 is a concave-convex surface. The display panel according to some embodiments may be formed in the following manufacturing methods.

In one manufacturing method, the first spacer structure 41 is formed after exposure and development by using a halftone mask, so that a surface of the first spacer structure 41 away from the substrate 10 is a concave-convex surface. The half-tone mask for forming the first spacer structure 41 has regions with different light transmittance. The surface of the first spacer structure 41 finally formed is a concave-convex surface through different exposure degrees.

In another manufacturing method, the bottom of the second aperture 32 has a concave-convex surface after exposure and development by using a half-tone mask when forming the pixel definition layer 30. Then, the first spacer structure 41 is formed in the second aperture 32, and the first spacer structure 41 is formed on the concave-convex surface, so that a surface of the first spacer structure 41 away from the substrate 10 is a concave-convex surface. With the manufacturing method, the transmission path of the leakage current can be increased by using the concave-convex surface of the first spacer structure 41, thereby further hindering the transmission of the leakage current and ameliorating the undesirable lighting of the sub-pixels. Moreover, a contact area between the first spacer structure 41 and the base below can be increased, thereby improving reliability of bonding between the two and preventing peeling of the first spacer structure 41 from the base.

Figure 16:
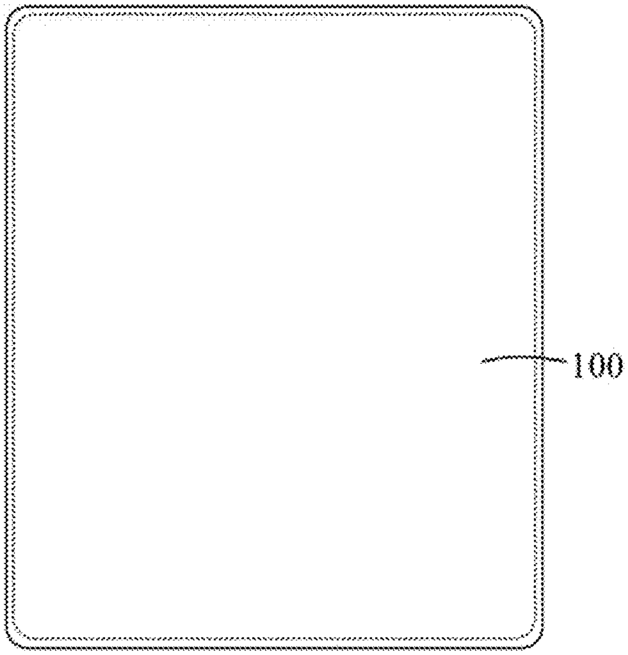
FIG. 16 is a schematic diagram of a display device according to some embodiments of the present disclosure.

Based on a same inventive concept, some embodiments of the present disclosure further provide a display device. FIG. 16 is a schematic diagram of a display device according to some embodiments of the present disclosure. As shown in FIG. 16, the display device includes the display panel 100 according to any embodiment of the present disclosure. The structure of the display panel 100 has been described in the above embodiments. Details are not described herein again. The display device according to the embodiments of the present disclosure may be an electronic device such as a mobile phone, a tablet computer, a computer, or a TV.

The above-described embodiments are merely preferred embodiments of the present disclosure and are not intended to limit the present disclosure. Any modifications, equivalent substitutions and improvements made within the principle of the present disclosure shall fall into the protection scope of the present disclosure.

Finally, it should be noted that the above-described embodiments are merely for illustrating the present disclosure but not intended to provide any limitation. Although the present disclosure has been described in detail with reference to the above-described embodiments, it should be understood by those skilled in the art that, it is still possible to modify the technical solutions described in the above embodiments or to equivalently replace some or all of the technical features therein, but these modifications or replacements do not cause the essence of corresponding technical solutions to depart from the scope of the present disclosure.

What is claimed is:

1. A display panel, comprising:

a substrate;

light-emitting devices;

a pixel definition layer, wherein the light emitting devices and the pixel definition layer are located at a side of the substrate, wherein the pixel definition layer comprises:

apertures, wherein the apertures comprise first apertures provided with the light-emitting devices and a second aperture; and bank portions; and a first spacer structure provided in the second aperture;

wherein along a direction perpendicular to a plane of the substrate, one bank portion of the bank portions comprises a first part, a distance from a surface of the first spacer structure away from the substrate towards the substrate is $d_1$, and a distance from a surface of the first part away from the substrate towards the substrate is $d_2$, where $d_1>d_2$, wherein the display panel further comprises a support post located at a side of the first part away from the substrate, and one of the light-emitting devices comprises a first electrode located at a side of the pixel definition layer close to the substrate, wherein along the direction perpendicular to the plane of the substrate, the support post does not overlap with the first electrode and a distance from a surface of the support post away from the substrate to the substrate is $d_3$, wherein $d_3>d_1$.

2. The display panel according to claim 1, wherein the first spacer structure comprises a side surface and a bottom surface located at a side of the substrate, and an angle $\alpha$ formed between the side surface and the bottom surface is an acute angle.

3. The display panel according to claim 2, wherein $60°\leq\alpha<90°$.

4. The display panel according to claim 2, wherein the support post comprises a first sidewall and a first bottom surface, wherein the first bottom surface is a surface of the support post close to the substrate; and an angle between the first sidewall and the first bottom surface is $\beta$, wherein $\beta<\alpha$.

5. The display panel according to claim 4, wherein one bank portion of the bank portions comprises a second sidewall, the one bank portion and one of the first apertures share the second sidewall, and an angle formed between the second sidewall and a plane parallel to the plane of the substrate and pointing to the one bank portion is θ, wherein θ<β.

6. The display panel according to claim 2, wherein in a direction from one of the first apertures to the first spacer structure, a width of the bottom surface is D, wherein 2 μm≤D≤10 μm.

7. The display panel according to claim 1, wherein along the direction perpendicular to the plane of the substrate, a depth of the second aperture is $h_1$, and a thickness of the first part is H, where $2*H/3 \le h_1 \le H$.

8. The display panel according to claim 1, wherein one of the first apertures overlaps with the first electrode, and the second aperture does not overlap with the first electrode.

9. The display panel according to claim 1, wherein the surface of the first spacer structure away from the substrate is a concave-convex surface.

10. The display panel according to claim 1, wherein a material of the first spacer structure is the same as a material of the pixel definition layer.

11. The display panel according to claim 1, wherein the support post and the first spacer structure are formed by a same material.

12. The display panel according to claim 1, further comprising a second spacer structure provided in the second aperture, wherein a side surface of the first spacer structure and a side surface of the second spacer structure that are opposite to each other intersect each other.

13. The display panel according to claim 1, wherein:

the second aperture comprises a first sub-aperture located between two adjacent first apertures of the first apertures;

a first midline is defined between the two adjacent first apertures, and minimum distances from the first midline to the two first apertures are equal to each other; and wherein the first sub-aperture overlaps with the first midline.

14. The display panel according to claim 1, wherein:

the second aperture comprises a second sub-aperture located between two adjacent first apertures;

a first midline is defined between two adjacent first apertures; and minimum distances from the first midline to the two first apertures are equal to each other, wherein the second sub-aperture is located at a side of the first midline.

15. The display panel according to claim 1 wherein:

along the direction perpendicular to the plane of the substrate, the first spacer structure has a height; and in a direction from one of the first apertures to the first spacer structure, a bottom surface of the first spacer structure has a width;

wherein the light-emitting devices comprises:

a first light-emitting device; and a second light-emitting device in different colors, and wherein the first spacer structure comprises:

a type-A first spacer structure; and a type-B first spacer structure, wherein the type-A first spacer structure is arranged around the first light-emitting device, and the type-B first spacer structure is arranged around the second light-emitting device, and wherein the type-A first spacer structure and the type-B first spacer structure are different in at least one of height, width, or number.

16. The display panel according to claim 1, wherein:

along the direction perpendicular to the plane of the substrate, the first spacer structure has a height; and in a direction from the first aperture to the first spacer structure, a bottom surface of the first spacer structure has a width;

wherein the light-emitting devices comprise:

a first light-emitting device, a second light-emitting device, and a third light-emitting device in different colors, and the first spacer structure comprises:

a type-C first spacer structure, and a type-D first spacer structure, wherein the type-C first spacer structure is located between the first light-emitting device and the second light-emitting device, and the type-D first spacer structure is located between the first light-emitting device and the third light-emitting device, and wherein the type-C first spacer structure and the type-D first spacer structure are different in at least one of height, width, or number.

17. A display device comprising a display panel according to claim 1.

18. A display panel, comprising:

a substrate;

light-emitting devices;

a pixel definition layer, wherein the light emitting devices and the pixel definition layer are located at a side of the substrate, wherein the pixel definition layer comprises:

apertures, wherein the apertures comprise first apertures provided with the light-emitting devices and a second aperture; and bank portions; and a first spacer structure provided in the second aperture;

wherein along a direction perpendicular to a plane of the substrate, one bank portion of the bank portions comprises a first part, a distance from a surface of the first spacer structure away from the substrate towards the substrate is $d_1$, and a distance from a surface of the first part away from the substrate towards the substrate is $d_2$, where $d_1>d_2$, wherein the first spacer structure comprises a side surface and a bottom surface located at a side of the substrate, and an angle a formed between the side surface and the bottom surface is an acute angle; and wherein the display panel further comprising a support post located at a side of the first part away from the substrate, wherein the support post comprises a first sidewall and a first bottom surface, wherein the first bottom surface is a surface of the support post close to the substrate; and an angle between the first sidewall and the first bottom surface is β, wherein β<α.

19. A display panel, comprising:

a substrate;

light-emitting devices;

a pixel definition layer, wherein the light emitting devices and the pixel definition layer are located at a side of the substrate, wherein the pixel definition layer comprises:

apertures, wherein the apertures comprise first apertures provided with the light-emitting devices and a second aperture; and bank portions; and a first spacer structure provided in the second aperture;

wherein along a direction perpendicular to a plane of the substrate, one bank portion of the bank portions comprises a first part, a distance from a surface of the first spacer structure away from the substrate towards the substrate is $d_1$, and a distance from a surface of the first part away from the substrate towards the substrate is $d_2$, where $d_1>d_2$, wherein along the direction perpendicular to the plane of the substrate, the first spacer structure has a height; and in a direction from one of the first apertures to the first spacer structure, a bottom surface of the first spacer structure has a width;

wherein the light-emitting devices comprises:

a first light-emitting device; and a second light-emitting device in different colors, and wherein the first spacer structure comprises:

a type-A first spacer structure; and a type-B first spacer structure, wherein the type-A first spacer structure is arranged around the first light-emitting device, and the type-B first spacer structure is arranged around the second light-emitting device, and wherein the type-A first spacer structure and the type-B first spacer structure are different in at least one of height, width, or number.

* * * * *